United States Patent [19]

Van Dyk Soerewyn

[11] Patent Number: 4,514,587
[45] Date of Patent: Apr. 30, 1985

[54] HIGH POWER SEMICONDUCTOR PACKAGE

[75] Inventor: Herman F. Van Dyk Soerewyn, Peabody, Mass.

[73] Assignee: Unitrode Corporation, Peabody, Mass.

[21] Appl. No.: 333,732

[22] Filed: Dec. 23, 1981

[51] Int. Cl.³ .............................................. H05K 5/04
[52] U.S. Cl. .................................. 174/52 H; 357/74; 357/81
[58] Field of Search ............... 174/52 H, 52 S, 52 PE, 174/16 HS; 357/74, 81, 72

[56] References Cited

U.S. PATENT DOCUMENTS

| | | | |
|---|---|---|---|
| 2,674,646 | 4/1954 | Schoch | 174/52 PE |
| 3,361,868 | 1/1968 | Bachman | 174/16 HS |
| 3,541,478 | 11/1970 | Peterson et al. | 174/52 PE |
| 4,047,197 | 9/1977 | Schierz | 357/81 |
| 4,394,530 | 7/1983 | Kaufman | 174/16 HS |

*Primary Examiner*—A. T. Grimley
*Assistant Examiner*—D. A. Tone
*Attorney, Agent, or Firm*—Weingarten, Schurgin, Gagnebin & Hayes

[57] ABSTRACT

A high power semiconductor package which includes a substantially continuous mounting surface for efficient thermal mounting to a heat sink and which can be electrically isolated or non-isolated. The package includes a metal header having a cylindrical section and a peripheral mounting flange. The cylindrical section has an annular portion adjacent to the mounting flange into which is press fitted a thermally conductive disk having an outer surface which is substantially coplanar with the mounting surface of the flange. One or more semiconductor devices are mounted within the cylindrical section in thermal communication with the conductive disk, and are electrically connected to leads which outwardly extend from the top of the header. An encapsulant can be provided within the header to enclose the semiconductor devices, and an electrically insulating cap can be secured to the cylindrical section and through which the leads extend.

14 Claims, 5 Drawing Figures

HIGH POWER SEMICONDUCTOR PACKAGE

FIELD OF THE INVENTION

This invention relates to power semiconductors, and more particularly to a power semiconductor package.

BACKGROUND OF THE INVENTION

A major consideration in the design of power semiconductor packages is the manner of mounting the semiconductor elements for efficient thermal dissipation to prevent overheating and possible destruction of the semiconductors. High power packages of various configurations are known for the thermal and electrical packaging of power semiconductors, one known form being known as a TO-3 package. The conventional TO-3 package has a header plate with a cylindrical section and a mounting flange, with the electrical leads extending through the bottom mounting surface of the header. The leads are glass sealed to the header and are electrically insulated therefrom, and extend outwardly from the mounting surface. One or more semiconductor die assemblies are mounted on the header within the cylindrical section, and a cover is welded over this section to enclose the semiconductors. The holes in the mounting surface, through which the leads extend and are sealed, interrupt the mounting surface and lessen the thermal contact area of that surface. As a result, the thermal dissipation is decreased in comparison to that of a continuous mounting surface. The conventional TO-3 package requires double-sided mounting wherein the package is mechanically mounted on one side of the heat sink, while the electrical connections must be made on the other side.

SUMMARY OF THE INVENTION

The present invention provides a high power semiconductor package which is similar to the TO-3 configuration and which includes a substantially continuous mounting surface for efficient thermal mounting to a heat sink. The leads outwardly extend from the top of the package rather than from the bottom of the package through the mounting surface, as in conventional packages, and thus the leads offer no obstruction to the continuity of the mounting surface and make single-sided mounting possible. The package includes a metal header having a cylindrical section and a peripheral mounting flange adapted for attachment to a mounting surface. The cylindrical section has an annular portion adjacent to the mounting flange into which is fitted a thermally conductive disk having an outer surface which is substantially coplanar with the mounting surface of the flange. One or more semiconductor die assemblies or other semiconductor or hybrid devices are mounted within the cylindrical section in thermal communication with the heat conductive disk, and are electrically connected to terminals or leads which outwardly extend from the top of the header. The die assemblies can be either electrically connected or isolated from the thermally conductive disk. An electrically insulating cap can be secured to the cylindrical section and through which the leads extend. An encapsulant can be provided within the header to enclose the die assemblies.

DESCRIPTION OF THE DRAWINGS

The invention will be more fully understood from the following detailed description taken in conjunction with the accompanying drawings, in which.

DETAILED DESCRIPTION OF THE INVENTION

Figure 1:
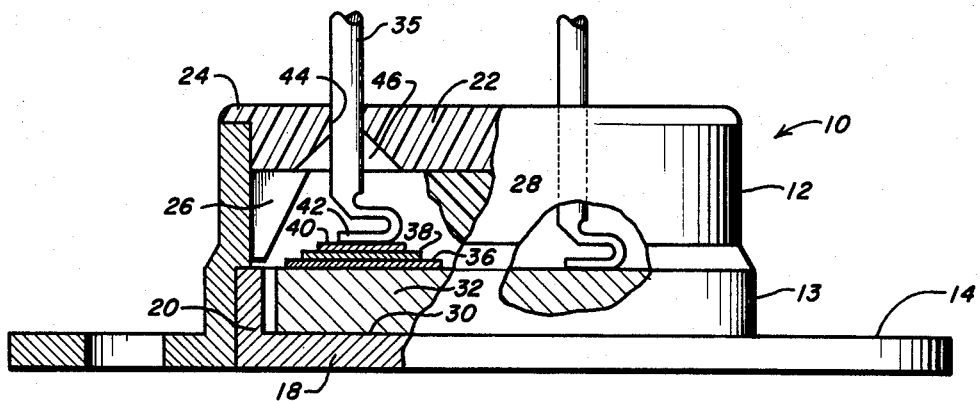
FIG. 1 is a sectional elevation view of a power semiconductor package according to the invention in which the die assemblies are electrically isolated from the header.
Figure 2:
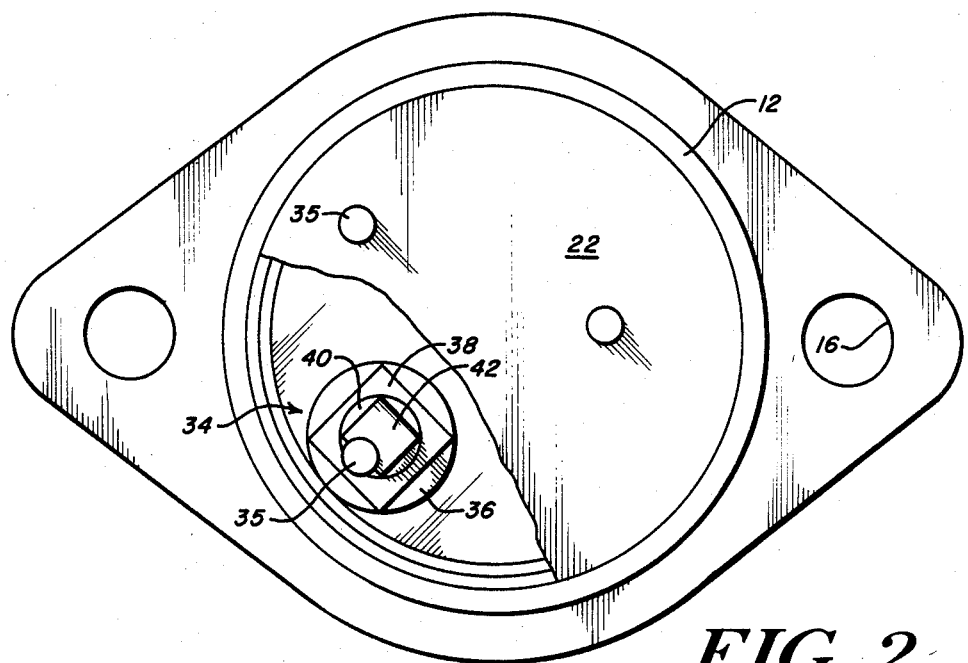
FIG. 2 is a cutaway top view of the package of FIG. 1.

Referring to FIGS. 1 and 2 of the drawings, there is shown a power semiconductor package which includes a header 10 having a cylindrical section 12 and a peripheral flange 14 which includes openings 16 for mounting of the header onto a heat sink or other mounting surface. Cylindrical section 12 includes an annular portion 13 adjacent to the flange 14 which is of larger inside diameter than that of the outer portion of section 12, and in which is secured a disk 18 having a raised peripheral lip 20 which has an outside diameter sized to be press fitted into the portion 13 of section 12. The outer surface of the disk 18 is substantially coplanar with or slightly protruding beyond the mounting surface of flange 14. A cap 22 is fitted into the outer end of section 12, the cap having a cylindrical portion which is fitted into section 12, and a surrounding lip 24 which is configured to fit over the outer edge of section 12. The cap 22 includes inwardly extending ribs 26 which serve to anchor the cap to an encapsulant 28 within the housing. The cap 22 is typically formed of an insulative material such as epoxy. An electrically insulative layer 30 is provided on the inner surface of disk 18 on which is disposed a thermally and electrically conductive disk 32.

One or more semiconductor die assemblies 34 are mounted on the inner surface of disk 32, each assembly being connected to a respective terminal or lead 35 which outwardly extends from the top of the package, opposite to the mounting flange. Each die assembly 34 includes a conductive plate 36 on which a semiconductor chip 38 is mounted, and on top of which a second conductive plate 40 is mounted. The upper and lower conductive plates provide electrical connection to the terminal areas of the semiconductor chip and also serve to provide thermal matching between the chip and the mounting materials. The die assembly is itself of known construction, and the conductive plates are typically molybdenum to provide thermal matching between the semiconductor and the disk 32, which typically is copper. The terminals 35 are respectively connected to the associated die assemblies and the electrically conductive disk 32 via a C-shaped contact 42 provided on the end of the terminal. Each terminal 35 extends through an opening 44 provided in cap 22, and each opening in the cap includes a conical inner section 46 for ease of insertion of cap 22 over terminals 35. The terminals are typically nickel-plated copper, and can have any end configuration to suit the intended connection arrangement.

The header is preferably fabricated as a steel stamping which provides a readily formed and relatively inexpensive component. The bottom disk 18, which typically is of nickel-plated copper, is press fitted, soldered, or brazed within the opening 13 in the confronting portion of the header. The insulative layer 30 and conductive disk 32 are retained on the disk 18, typically by an adhesive.

The package provides highly efficient thermal mounting by virtue of the package construction and the substantially continuous mounting surface provided by the mounting flange 14 and disk 18. Heat generated by the semiconductor elements is readily dissipated outward through the disk 32 which serves to spread and conduct heat to the disk 18 and surrounding header for conduction to the heat sink on which the package is mounted.

Figure 3:
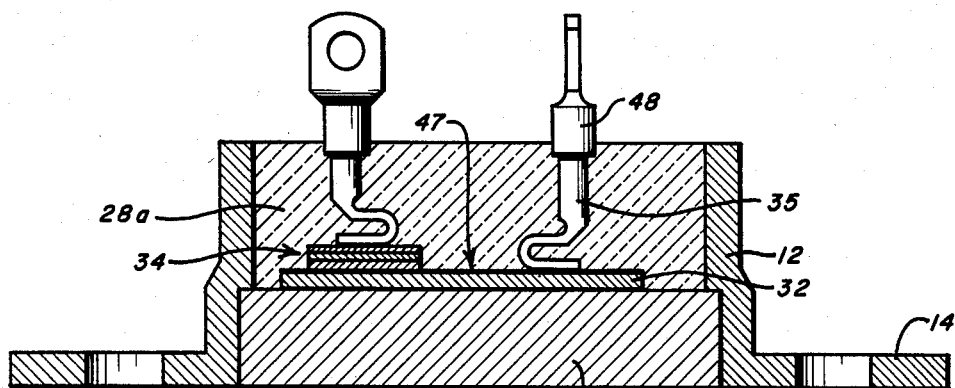
FIG. 3 is a sectional elevation view of an alternative embodiment employing a potted construction without a separate plastic cap.

As an alternative, the disk 32 can be of thermally conductive and electrically insulative material such as alumina or beryllia. As shown in FIG. 3, this electrically insulative disk 32 is mounted directly on disk 18 without need for the interposed electrically insulative layer 30, as in the embodiment described above. The one or more die assemblies 34 are mounted on the inner surface of the electrically insulated disk 32, and electrical connection between the respective dice can be provided by a conductive layer 47 on which the die assemblies are mounted, as shown in FIG. 3, or by providing a conductive layer between the die assemblies which are to be electrically interconnected.

Figure 4:
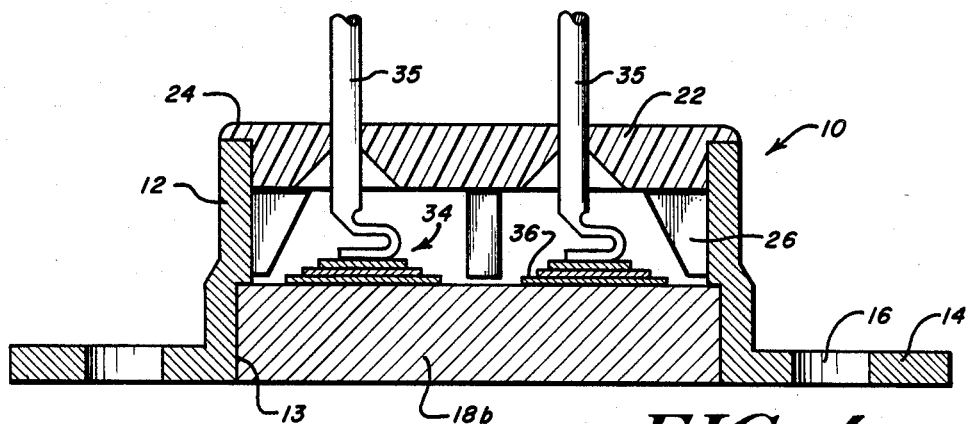
FIG. 4 is a sectional elevation view of a further embodiment in which the header is an electrical terminal for the device.

An alternative embodiment is shown in FIG. 4 which provides a non-isolated interconnection between the plates 36 and the disk 18b, wherein the header 10 serves as a common electrical terminal. In the embodiments previously described, the header is electrically isolated from the electrical elements of the device. In this embodiment, an electrically and thermally conductive disk 18b, typically of nickel-plated copper, is press fitted into the opening 13 of the header. The die assemblies 34 are mounted on the inner surface of this conductive disk 18b, and the package is completed in the manner previously described. In this embodiment, the header provides for efficient thermal mounting of the package and also serves as a common electrical terminal.

The novel package can be employed for a variety of power devices in which heat is to be efficiently dissipated in order to provide proper device operation and to prevent damage or destruction of the device. The power device can be, for example, rectifiers, power transistors, triacs, power hybrid devices, and the like. The devices can be of various terminal configurations, with the package being electrically isolated or non-isolated, as desirable. FIG. 3 shows a lug type termination 48 of the leads 35. An alternate package construction eliminating the use of cap 22 is also shown in FIG. 3. The die assemblies 34 are protected by a suitable potting compound 28a which is contained in the cylindrical section 12 of header 14, and which fills this entire cavity.

The package can also be constructed in a hermetically sealed version. To provide such hermetic sealing, the disk 18 is brazed or welded to the header to provide a sealed bond therebetween, and a cap 22 is provided which is of a material which can be brazed or welded to the header. The cap can be a ceramic which can be brazed to the header and through which the leads 35 extend and are sealed by glass seals. The cap can also be metal, with the glass seals providing electrical insulation of the leads from the cap, as well as providing hermetic sealing.

Figure 5:
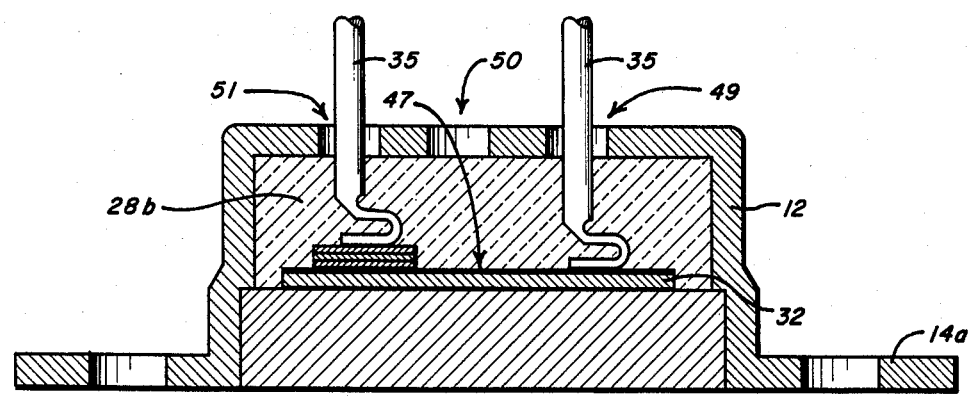
FIG. 5 is a sectional elevation view of a further embodiment incorporating a metal cap which is integral with the header.

A further alternative package construction is shown in FIG. 5, in which the header 14a includes an integral top 51 having clearance holes 49 for the leads 35, and a fill opening 50 through which an encapsulant 28b is injected into the cavity formed within the cylindrical section 12 of header 14a.

The power devices can be assembled by any convenient means. Typically, the devices are inserted into the package and retained by fixturing apparatus during the soldering operation of the die assembly and the associated leads to the mounting surface. Thereafter, the fixturing apparatus is removed, and the package assembly is completed. An encapsulant is dispensed into the interior of the package section 12, and the cap 22 is then installed to complete the assembly. Alternatively, the section 12 can be filled completely with an encapsulant to complete the assembly without need for a cap 22, as is shown in FIG. 3.

The invention is not to be limited by what has been particularly shown and described except as in the appended claims.

What is claimed is:

1. A power semiconductor package comprising:
   a metal header having a cylindrical section and a peripheral mounting flange adapted for attachment to a mounting surface, the cylindrical section having an annular portion adjacent the mounting flange;
   a thermally conductive metallic disk having spaced-apart surfaces and a peripheral circumferential wall mounted in the annular portion of the cylindrical section with the peripheral circumferential wall of the cnductive disk in frictionally abutting relation with the confronting wall of the annular portion, and with one of said spaced surfaces disposed within said cylindrical section and with the other one of said spaced surfaces substantially coplanar with the mounting surface of the flange;
   one or more die assemblies each mounted on said surface of the disk within the cylindrical section;
   an electrically insulating cap secured to the cylindrical section and having openings therethrough;
   a plurality of electrical terminals, each extending through a respective opening in the cap, accessible from the same side as the mounting surface on which the package will be mounted;
   means electrically connecting each die assembly to a respective terminal; and
   an encapsulant within the cylindrical section enclosing the die assemblies.

2. The power semiconductor package of claim 1 wherein the thermally conductive disk is also electrically conductive.

3. The power semiconductor package of claim 1 wherein the thermally conductive disk has a raised peripheral lip having an outside diameter sized to be press fitted into the annular portion of the cylindrical section of the header.

4. The power semiconductor package of claim 3 wherein the cap includes inwardly extending ribs operative to anchor the cap to the encapsulant within the header, and a surrounding lip configured to fit over the outer edge of the cylindrical section of the header.

5. The power semiconductor package of claim 4 wherein the cap includes a conical opening in communication with each of the openings in the cap and confronting the interior of the cylindrical section for ease of insertion of the cap over the terminals.

6. The power semiconductor package of claim 1 wherein the cylindrical section of the header has a first inside diameter, and wherein the annular portion of the cylindrical section has a second inside diameter larger than the first inside diameter, the cylindrical section defining an interior chamber in which the die assemblies are contained.

7. The power semiconductor package of claim 6 wherein the metal header includes openings in the peripheral mounting flange for attachment of the header to the mounting surface.

8. The power seminconductor package of claim 7 wherein the metal header is a metal stamping.

9. A power semiconductor package comprising:
a metal header having a cylindrical section and a peripheral mounting flange adapted for attachment to a mounting surface, the cylindrical section having an annular portion adjacent the mounting flange;
an electrically and thermally conductive metallic disk having spaced-apart surfaces and a peripheral circumferential wall mounted in the annular portion of the cylindrical section with the peripheral circumferential wall of the electrically and thermally conductive disk in frictionally abutting relation with the confronting wall of the annular portion, and with one of said spaced surfaces disposed within said cylindrical section and with the other one of said spaced surfaces substantially coplanar with the mounting surface of the flange;
one or more die assemblies each mounted on said surface of the disk within the cylindrical section;
an electrically insulating cap secured to the cylindrical section and having openings therethrough;
a plurality of electrical terminals, each extending through a respective opening in the cap, accessible from the same side as the mounting surface on which the package will be mounted;
means electrically connecting each die assembly to a respective terminal, and the surface of the conductive disk within the cylindrical section to a respective terminal; and
an encapsulant within the cylindrical section enclosing the die assemblies.

10. A power semiconductor package comprising:
a metal header having a cylindrical section and a peripheral mounting flange adapted for attachment to a mounting surface, the cylindrical section having an annular portion adjacent the mounting flange;
a thermally conductive metallic disk having spaced-apart surfaces and a peripheral circumferential wall mounted in the annular portion of the cylindrical section with the peripheral circumferential wall of the thermally conductive disk in frictionally abutting relation with the confronting wall of the annular portion, and with one of said spaced surfaces disposed within said cylindrical section and with the other one of said spaced surfaces substantially coplanar with the mounting surface of the flange;
one or more die assemblies each mounted on said surface of the disk within the cylindrical section;
a plurality of electrical terminals, each extending from the cylindrical section and accessible from the same side as the mounting surface on which the package will be mounted;
means electrically connecting each die assembly to a respective terminal; and
an encapsulant within the cylindrical section enclosing the die assemblies.

11. A power semiconductor package comprising:
a metal header having a cylindrical section and a peripheral mounting flange adapted for attachment to a mounting surface, the cylindrical section having an annular portion adjacent the mounting flange; and a top portion integral with the header having a plurality of openings therethrough;
a thermally conductive metallic disk having spaced-apart surfaces and a peripheral circumferential wall mounted in the annular portion of the cylindrical section with the peripheral circumferential wall of the thermally conductive disk in frictionally abutting relation with the confronting wall of the annular portion of the cylindrical section, with one of said spaced surfaces disposed within said cylindrical section and with the other one of said spaced surfaces substantially coplanar with the mounting surface of the flange;
one or more die assemblies each mounted on said surface of the disk within the cylindrical section;
a plurality of electrical terminals, each extending through a respective opening in the top, accessible from the same side as the mounting surface on which the package will be mounted;
means electrically connecting each die assembly to a respective terminal; and
an encapsulant within the cylindrical section enclosing the die assemblies.

12. The power semiconductor of claim 11 wherein the top of the header includes an opening for injecting the encapsulant in the cylindrical section.

13. A power semiconductor package comprising:
a metal header having a cylindrical section and a peripheral mounting flange adapted for attachment to a mounting surface, the cylindrical section having an annular portion adjacent the mounting flange;
an electrically and thermally conductive metallic disk having spaced-apart surfaces and a peripheral circumferential wall mounted in the annular portion of the cylindrical section with the peripheral circumferential wall of the electrically and thermally conductive disk in frictionally abutting relation with the confronting wall of the annular portion of the cylindrical section, with one of said spaced surfaces disposed within the cylindrical section and with the other one of said spaced surfaces substantially coplanar with the mounting surface of the flange;
an electrically insulative disk mounted on said surface of the conductive disk within the cylindrical section;
an electrically conductive layer on the inner surface of the insulative disk;
one or more die assemblies each mounted on the electrically insulative disk;
an electrically insulating cap secured to the cylindrical section and having openings therethrough;

a plurality of electrical terminals, each extending through a respective opening in the cap, accessible from the same side as the mounting surface on which the package will be mounted;

means electrically connecting each die assembly to a respective terminal, and the conductive layer to a respective terminal; and an encapsulant within the cylindrical section enclosing the die assemblies.

14. A power semiconductor package comprising:

a metal header having a cylindrical section and a peripheral mounting flange adapted for attachment to a mounting surface, the cylindrical section having an annular portion adjacent the mounting flange;

an electrically and thermally conductive metallic disk having spaced-apart surfaces and a peripheral circumferential wall mounted in the annular portion of the cylindrical section with the peripheral circumferential wall of the electrically and thermally conductive disk in frictionally abutting relation with the confronting wall of the annular portion of the cylindrical section, with one of the spaced surfaces disposed within the cylindrical section and with the other one of the surfaces substantially coplanar with the mounting surface of the flange;

an electrically insulating layer on the surface of said disk disposed within the cylindrical section;

a second electrically and thermally conductive disk mounted on the insulative layer and having an inner mounting surface;

one or more die assemblies each mounted on the inner mounting surface of the second disk;

an electrically insulating cap secured to the cylindrical section and having openings therethrough;

a plurality of electrical terminals, each extending through a respective opening in the cap, accessible from the same side as the mounting surface on which the package will be mounted;

means electrically connecting each die assembly to a respective terminal, and the second disk to a respective terminal; and an encapsulant within the cylindrical section enclosing the die assemblies.

* * * * *